United States Patent
Kadota et al.

(10) Patent No.: US 6,356,167 B1
(45) Date of Patent: Mar. 12, 2002

(54) SURFACE ACOUSTIC WAVE RESONATOR, SURFACE ACOUSTIC WAVE FILTER, DUPLEXER COMMUNICATIONS APPARATUS AND SURFACE ACOUSTIC WAVE APPARATUS, AND PRODUCTION METHOD OF SURFACE ACOUSTIC WAVE RESONATOR

(75) Inventors: Michio Kadota, Kyoto; Jun Nakanishi, Nagaokakyo; Makoto Kumatoriya, Omihachiman, all of (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 09/374,088

(22) Filed: Aug. 12, 1999

(30) Foreign Application Priority Data

Aug. 21, 1998 (JP) .............................. 10-235774

(51) Int. Cl.[7] .................. H03H 9/25; H03H 9/64; H03H 9/70; H03H 3/10
(52) U.S. Cl. .................. 333/193; 333/195; 333/133; 310/313 A; 310/360
(58) Field of Search ................ 333/133, 193–196; 310/313 A, 360

(56) References Cited

U.S. PATENT DOCUMENTS 5,917,265 A * 6/1999 Naumenko et al. ...... 310/313 A
6,005,325 A * 12/1999 Inoue et al. ............ 310/313 A
6,137,207 A * 10/2000 Inoue et al. ............ 310/313 A

FOREIGN PATENT DOCUMENTS

| EP | 0 098 154 | | 1/1984 |
| EP | 0 874 455 | | 10/1998 |
| GB | 2328 815 A | * | 3/1999 |
| JP | 10-190407 | * | 7/1998 |
| JP | 11-27089 | * | 1/1999 |
| JP | 11-136083 | * | 5/1999 |
| WO | WO 97/25776 | * | 7/1997 |

OTHER PUBLICATIONS

K. Inoue et al., "Propagation Characteristics of Surface Acoustic Waves on Langasite," Feb. 4, 1998; Japanese Journal of Applied Physics; vol. 37, No 5B. pp 2909–2913.
H. Satoh et al., "Surface Acoustic Wave Propagation Characteristics on a langasite Crystal Plate," Mar. 14, 1997; Japanese Journal of Applied Physics; vol. 36, No 5B, pp 3071–3073.

* cited by examiner

Primary Examiner—Robert Pascal
Assistant Examiner—Barbara Summons
(74) Attorney, Agent, or Firm—Keating & Bennett, LLP

(57) ABSTRACT

A surface acoustic wave resonator includes a piezoelectric substrate made of a langasite single crystal and an interdigital transducer made of Al provided on the surface of the piezoelectric substrate. A Euler angle ($\phi$, $\theta$, $\phi$) of the piezoelectric substrate is approximately (0°, 140° to 150°, 24° ±1°), and the film thickness H of the interdigital transducer is within the range of about 0.005 to 0.15 with respect to the wavelength $\lambda$ of a surface acoustic wave generated on the piezoelectric substrate.

13 Claims, 5 Drawing Sheets

SURFACE ACOUSTIC WAVE RESONATOR, SURFACE ACOUSTIC WAVE FILTER, DUPLEXER COMMUNICATIONS APPARATUS AND SURFACE ACOUSTIC WAVE APPARATUS, AND PRODUCTION METHOD OF SURFACE ACOUSTIC WAVE RESONATOR

BACKGROUND OF THE INVENTION

1. Field of the Invention

The present invention relates to a surface acoustic wave resonator, a surface acoustic wave filter, a duplexer, and a communications apparatus including the same. More particularly, the present invention relates to a surface acoustic wave resonator having a piezoelectric substrate made of a single crystal material including langasite ($La_3Ga_5SiO_{14}$).

2. Description of the Related Art

Conventionally, surface acoustic wave resonators have been used widely in band pass filters or other electronic components used in mobile communications equipment. As an example of such a surface acoustic wave resonator, a surface acoustic wave resonator or a surface acoustic wave filter having a configuration wherein an interdigital transducer (IDT) including a comb-shaped electrode is provided on a piezoelectric substrate is well known.

A piezoelectric single crystal, such as lithium niobate ($LiNbO_3$), lithium tantalate($LiTaO_3$), quartz, lithium tetraborate ($Li_2B_4O_7$) or the like, is used as the material for the piezoelectric substrate of such a surface acoustic wave resonator or surface acoustic wave filter.

The surface acoustic wave resonator and the surface acoustic wave filter are required to have a maximum electromechanical coupling coefficient ($K^2$), which represents the conversion efficiency of the electricity and the mechanical energy, and a minimum temperature coefficient of group delay time (TCD), which represents the fluctuation ratio of the frequency by the temperature.

Since surface acoustic wave filters using the above-mentioned $LiNbO_3$ or $LiTaO_3$ material have a large $K^2$, such surface acoustic wave filters have a large difference between the resonance frequency and the anti-resonance frequency, thereby achieving a wide band width. However, since such filters have a TCD which is larger than that of quartz, there is a problem that the operation frequency fluctuates greatly due to the temperature change.

Moreover, surface acoustic wave filters using a quartz substrate are advantageous in that they have a small frequency shift in temperature because of an extremely small TCD. However, since the quartz substrate surface acoustic wave filters have a small $K^2$, they are disadvantageous in that they have a small difference between the resonance frequency and the anti-resonance frequency and a narrow band width.

For providing a material having a TCD smaller than that of $LiNbO_3$ or $LiTaO_3$, and a $K^2$ larger than that of quartz, $Li_2B_4O_7$ has been used in surface acoustic wave filters and surface acoustic wave resonators. However, since $Li_2B_4O_7$ creates problems with handling and processing because of its deliquescence property and because the growth rate of the single crystal is low, use of $Li_2B_4O_7$ causes very poor productivity. Moreover, although $Li_2B_4O_7$ has a good temperature characteristic with respect to the frequency, it has a poor temperature characteristic with respect to $K^2$ so that the band undesirably changes according to the temperature. Thus, there are many problems with using $Li_2B_4O_7$ as a substrate material for a surface acoustic wave filter.

Recently, as a material for solving the above-mentioned problems, $La_3Ga_5SiO_{14}$ has been proposed. $La_3Ga_5SiO_{14}$ does not have the deliquescence property like $Li_2B_4O_7$, but has a high growth rate of a single crystal compared with that of $Li_2B_4O_7$. Moreover, $La_3Ga_5SiO_{14}$ has characteristics including a TCD which is smaller than that of $LiNbO_3$ or $LiTaO_3$, and a $K^2$ which is larger than that of quartz. A large number of reports have been made concerning the theoretical analyses or the experimental results relating to the prospective Euler angle or propagation direction of such an $La_3Ga_5SiO_{14}$ single crystal substrate.

However, the analyses and measured results described in such reports relate only to alone such that the TCD is optimum. The reports and analyses are not related to and do not describe devices in which an $La_3Ga_5SiO_{14}$ single crystal substrate is provided with other elements. Thus, the TCD is not optimum when other elements are added thereto.

SUMMARY OF THE INVENTION

To overcome the problems described above, preferred embodiments of the present invention provides a surface acoustic wave resonator which includes a langasite piezoelectric and has a greatly improved TCD.

According to one preferred embodiment of the present invention, a surface acoustic wave resonator includes a piezoelectric substrate made of a langasite single crystal, and an interdigital transducer including Al and located on the surface of the piezoelectric substrate. The Euler angle ($\phi$, $\theta$, $\psi$) of the piezoelectric substrate is preferably about (0°, 140° to 150°, 24°+1°), and the film thickness H of the interdigital transducer is preferably within the range of about 0.005 to about 0.15 with respect to the wavelength $\lambda$ of a surface acoustic wave to be excited on the piezoelectric substrate.

According to another preferred embodiment of the present invention, a surface acoustic wave device includes a piezoelectric substrate made of a langasite single crystal, and an interdigital transducer including Al and located on the surface of the piezoelectric substrate. The Euler angle ($\phi$, $\theta$, $\psi$) of the piezoelectric substrate is preferably about (0°, $\theta$, 24°±1°), and a cut angle $\theta$ of the Euler angle and a normalized film thickness H/$\lambda$ of the interdigital transducer preferably fall within an area surrounded by the straight lines linking the points represented by:

A ($\theta$=140°, H/$\lambda$=0.005)
B ($\theta$=143°, H/$\lambda$=0.005)
C ($\theta$=147°, H/$\lambda$=0.15)
D ($\theta$=150°, H/$\lambda$=0.15)

on a coordinate with respect to the cut angle $\theta$ and the normalized thickness H/$\lambda$, where H represents a film thickness of the interdigital transducer and $\lambda$ represents a wavelength to be excited on the piezoelectric.

According to still another preferred embodiment of the present invention, a method of manufacturing a surface acoustic wave device including a piezoelectric substrate made of a langasite single crystal and an interdigital transducer including Al and located on the surface of the piezoelectric substrate is provided. The method preferably includes the step of selecting a film thickness of the interdigital transducer in accordance with the Euler angle ($\phi$, $\theta$, $\psi$) of the piezoelectric substrate such that fluctuation of an operation frequency of the surface acoustic wave resonator is substantially zero between about 20° C. to about 30° C.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, preferred embodiments of the present invention are explained in detail with reference to the drawings.

Figure 1:
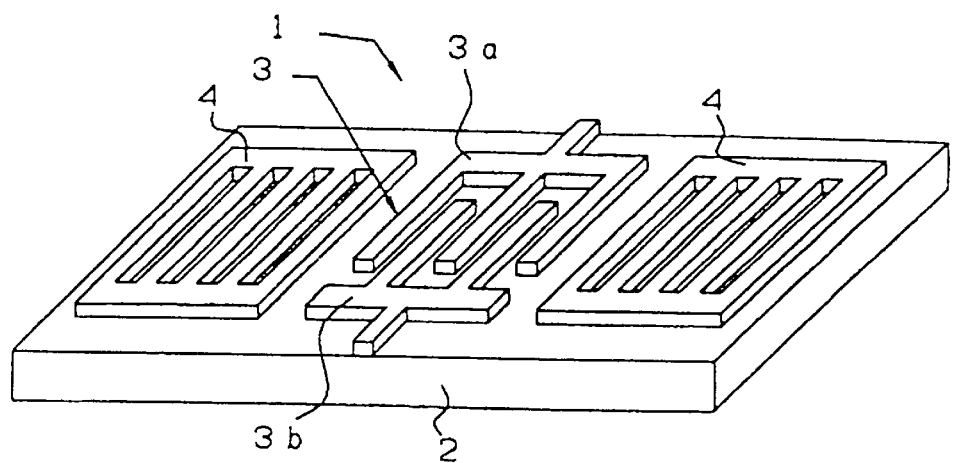
FIG. 1 is a perspective view of a surface acoustic wave resonator according to the first preferred embodiment of the present invention.

FIG. 1 is a perspective view of a surface acoustic wave resonator according to a first preferred embodiment of the present invention.

As shown in FIG. 1, a surface acoustic wave resonator 1 is provided by disposing an IDT 3 and reflectors 4 at opposite ends thereof, on a piezoelectric substrate 2 made of an $La_3Ga_5SiO_{14}$ single crystal.

The interdigital transducer 3 is preferably made of an electrode material including Al as a main component such that a pair of comb-shaped electrodes 3a, 3b are arranged with the comb tooth portions thereof facing each other.

Figure 2:
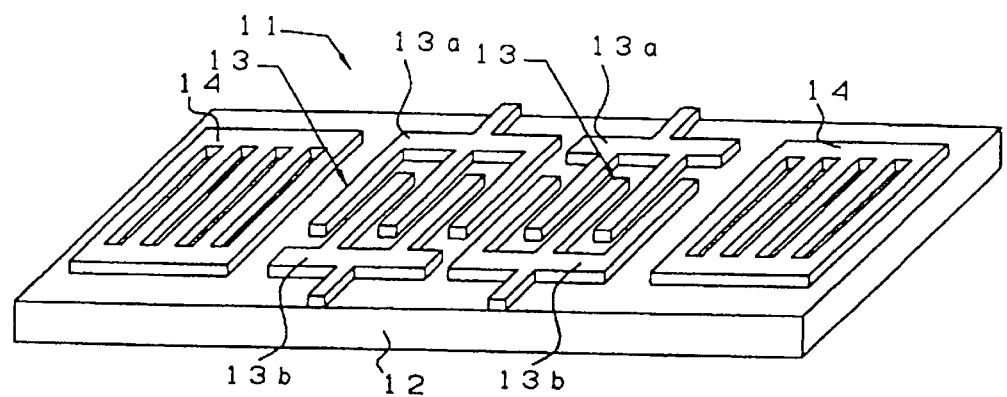
FIG. 2 is a perspective view of a longitudinally coupled surface acoustic wave filter according to the second preferred embodiment of the present invention.

FIG. 2 is a perspective view of a longitudinally coupled surface acoustic wave filter according to a second preferred embodiment of the present invention.

As shown in FIG. 2, the longitudinally coupled surface acoustic wave filter 11 is provided by disposing two IDTs 13, 13 and reflectors 14 at opposite ends thereof, on a piezoelectric substrate 12 made of an $La_3Ga_5SiO_{14}$ single crystal.

The IDTs 13 are preferably made of an electrode material including Al as a main component such that a pair of comb-shaped electrodes 13a, 13b are arranged with the comb tooth portions thereof facing each other. Moreover, the IDTs 13 are arranged substantially parallel to the surface acoustic wave propagation direction and separated by a certain distance.

Figure 3:
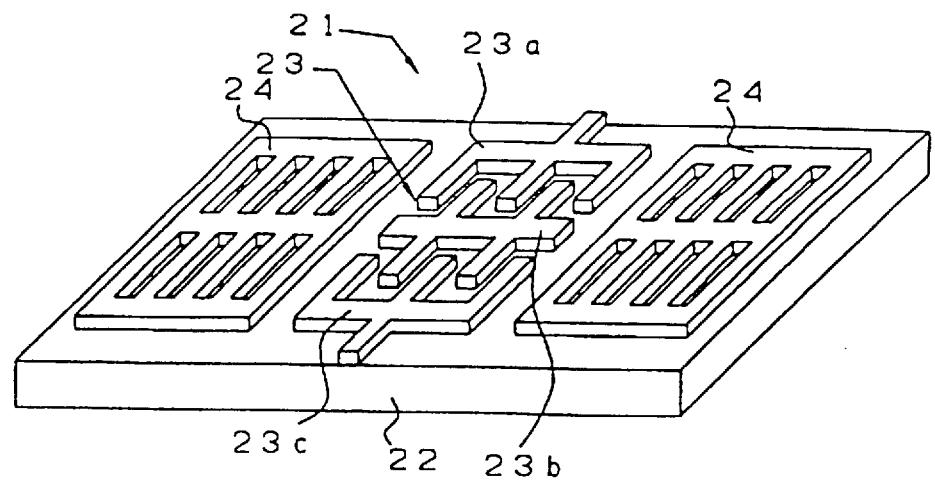
FIG. 3 is a perspective view of a transversely coupled surface acoustic wave filter according to the third preferred embodiment of the present invention.

FIG. 3 is a perspective view of a transversely coupled surface acoustic wave filter according to a third preferred embodiment of the present invention.

As shown in FIG. 3, the transversely coupled surface acoustic wave filter 21 is provided by disposing an IDT 23 and reflectors 24 on a piezoelectric substrate 22 made of an $La_3Ga_5SiOl_{14}$ single crystal.

The IDT 23 is preferably made of an electrode material including Al as a main component such that comb-shaped electrodes 23a, 23b and 23c are arranged with comb-shaped portions facing each other.

Figure 4:
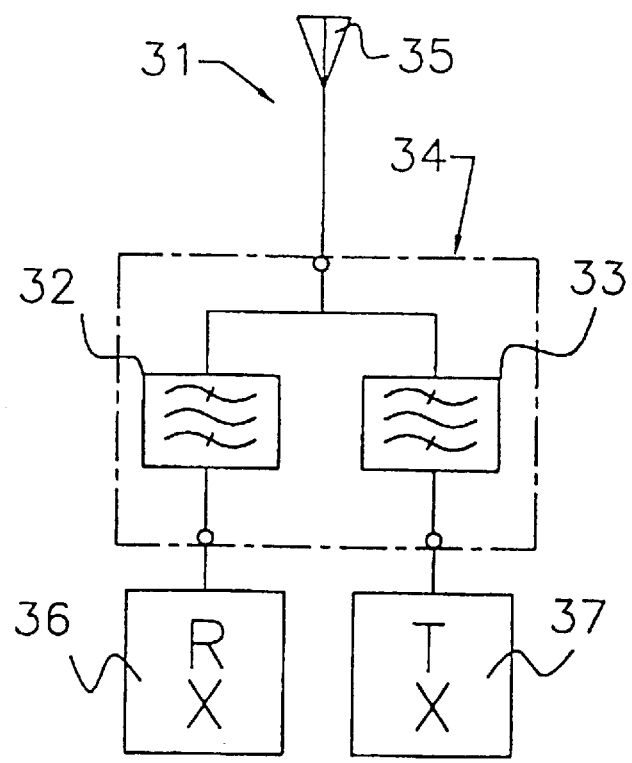
FIG. 4 is a block diagram for explaining a communication apparatus according to the fourth and fifth preferred embodiments.

FIG. 4 is a block diagram of a duplexer according to a fourth preferred embodiment of the present invention and a communications apparatus according to a fifth preferred embodiment of the present invention.

As shown in FIG. 4, the communications apparatus 31 is provided by connecting an antenna terminal of a duplexer 34 including a receiving surface acoustic wave filter 32 and a transmitting surface acoustic wave filter 33 with an antenna 35, connecting an output terminal with a receiving circuit 36, and connecting an input terminal with a transmitting circuit 37. For the receiving surface acoustic wave filter 32 and the transmitting surface acoustic wave filter 33 of the duplexer 34, the surface acoustic wave filters 11, 21 according to the second and third preferred embodiments are preferably used.

An experiment was conducted to see how the temperature (° C.) and the frequency shift (ppm) change according to the Euler angle of $La_3Ga_5SiO_{14}$ to be used as the substrate of a surface acoustic wave device mentioned above.

Data of the temperature (° C.) and the frequency shift are listed for each Euler angle in Table 1 below.

TABLE 1

| | Euler angle | | | | | |
|---|---|---|---|---|---|---|
| Temperature | (0,140,24) | (0,142,24) | (0,143,24) | (0,145,24) | (0,147,24) | (0,150,24) |
| −20 | −80.61150 | −123.23690 | −159.51539 | −239.36348 | −375.34423 | −730.51183 |
| −15 | −56.96931 | −97.87603 | −137.23505 | −194.45558 | −323.52717 | −638.43418 |
| −10 | −32.88929 | −78.19950 | −100.10116 | −156.52366 | −223.37655 | −563.81200 |
| −5 | −14.06310 | −48.02881 | −75.63648 | −121.64374 | −203.78186 | −471.29796 |
| 0 | −3.55546 | −35.34837 | −48.98745 | −94.61179 | −185.05805 | −391.43914 |
| 5 | −7.99685 | −20.91892 | −36.75511 | −68.88785 | −150.22305 | −327.29025 |
| 10 | 7.39000 | −6.05220 | −16.22225 | −51.88389 | −118.87156 | −283.21516 |
| 15 | 3.01181 | 7.06549 | −14.91164 | −32.69993 | −90.56812 | −236.95814 |
| 20 | 6.95218 | 7.06549 | −8.35860 | −23.54395 | −73.58606 | −187.64641 |
| 25 | 2.13618 | 7.94000 | 3.00000 | −15.69597 | −51.37875 | −140.51661 |
| 30 | −8.37146 | 0.50664 | −8.35860 | −0.43600 | −28.30056 | −102.55095 |
| 35 | −21.94383 | −6.05220 | −3.98991 | −0.43600 | −59.21662 | −66.76721 |
| 40 | −36.39184 | −14.79733 | −2.24243 | −0.21800 | 5.66356 | −60.22141 |
| 45 | −56.39367 | −32.28758 | −21.46468 | 0.00000 | 4.35725 | −50.18451 |
| 50 | −77.10895 | −45.84253 | −9.23234 | −10.46398 | 2.61550 | −28.36515 |

TABLE 1-continued

| | Euler angle | | | | | |
|---|---|---|---|---|---|---|
| Temperature | (0,140,24) | (0,142,24) | (0,143,24) | (0,145,24) | (0,147,24) | (0,150,24) |
| 55 | −100.31333 | −61.58376 | −38.06571 | −17.87596 | −16.10831 | −25.31045 |
| 60 | −128.77153 | −78.63675 | −58.59857 | −30.08394 | 27.00000 | −16.58271 |
| 65 | −159.41881 | −84.75834 | −83.93699 | −46.21590 | 15.67862 | −12.65522 |
| 70 | −194.00647 | −118.42708 | −100.97490 | −73.24784 | −27.67862 | −6.98219 |
| 75 | −230.34539 | −144.22520 | −133.74010 | −92.86780 | −47.89525 | 0.00000 |
| 80 | −269.31123 | −177.89394 | −168.68964 | −119.46374 | −69.66712 | −2.67436 |

Figure 5:
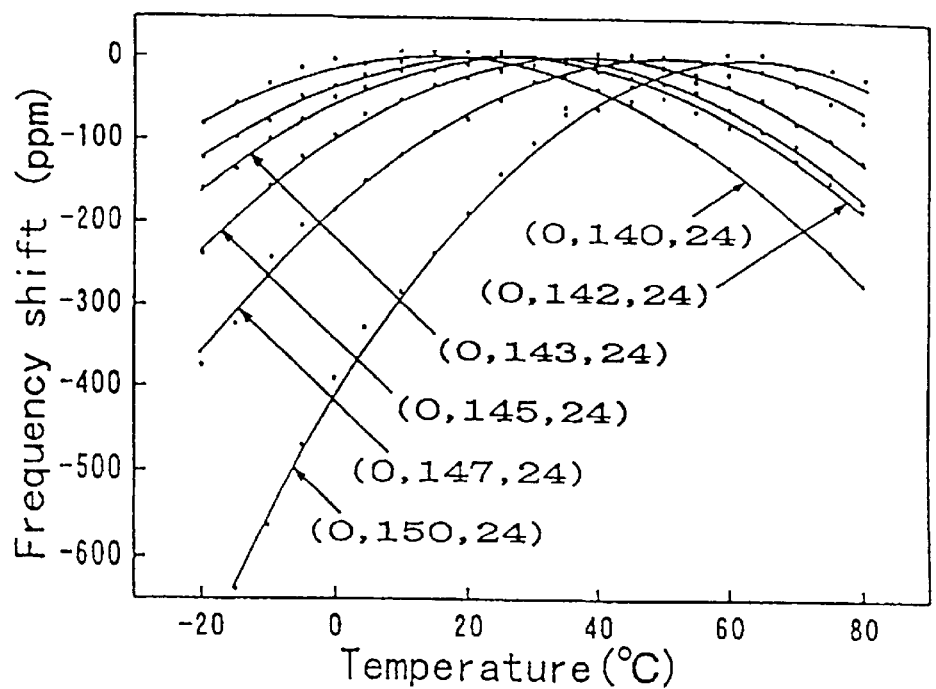
FIG. 5 is a characteristic graph showing the relationship between the temperature and the frequency shift with respect to the Euler angle.

In FIG. 5, the measured values of the frequency shift by the temperature of Table 1 are shown by •, and the approximate values thereof are shown by lines.

From FIG. 5, it is observed that an $La_3Ga_5SiOl_4$ single crystal produces a curve with the temperature at which the frequency shift is substantially zero as the turnover temperature. Moreover, it is observed that the curve moves to the high temperature side with a larger θ of the Euler angle (φ, θ, φ) of the $La_3Ga_5SiO_{14}$ single crystal.

Then, the turnover temperature at which the frequency shift is substantially zero was measured for each case, while changing the value of θ of the Euler angle (φ, θ, φ). The turnover temperatures are shown in Table 2 below.

The measurement shown in Table 2 was conducted while changing the cut angle θ of the Euler angle (φ, θ, φ), with an electrode having an approximately 0.0125 film thickness H respect to the wavelength λ of a surface acoustic wave generated on a piezoelectric substrate made of an $La_3Ga_5SiO_{14}$ single crystal.

TABLE 2

| Euler angle θ | Turnover temperature |
|---|---|
| 140 | 15.3 |
| 141 | 19.5 |
| 142 | 25.0 |
| 143 | 29.7 |
| 144 | 31.0 |
| 145 | 38.0 |
| 146 | 43.8 |
| 147 | 51.1 |
| 148 | 55.5 |
| 149 | 60.0 |
| 150 | 63.4 |

Figure 6:
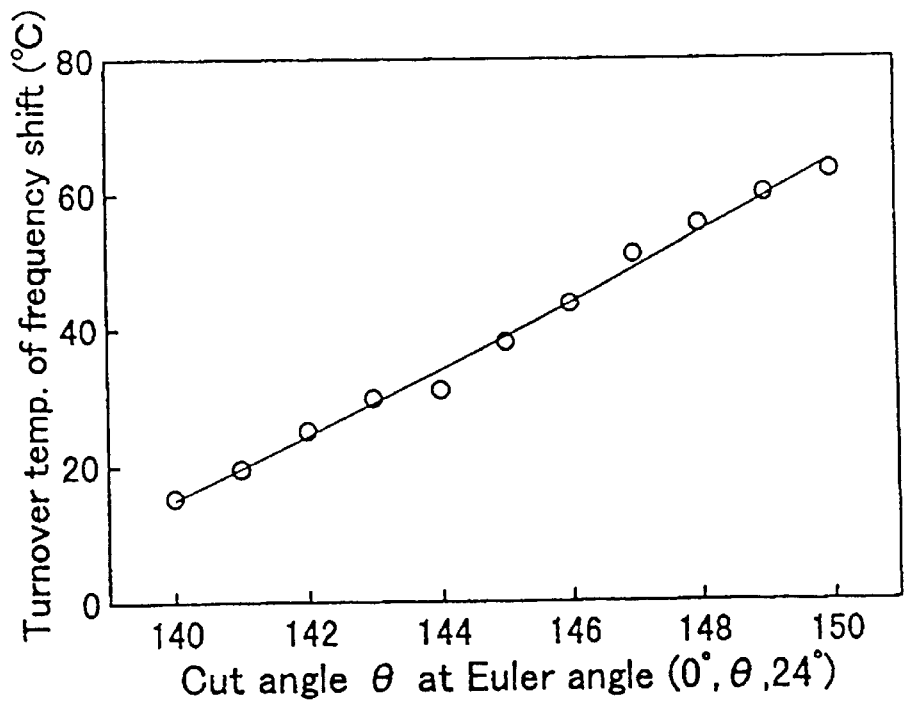
FIG. 6 is a characteristic graph showing the relationship between the Euler angle and the turnover temperature.

FIG. 6 shows how the turnover temperature changes by shifting θ (cut angle θ at Euler angle (0°, θ, 24°)) of the Euler angle (φ, θ, φ) by showing the turnover temperatures (turnover temperatures of frequency) of Table 2 by °, and the approximate values thereof by a line.

From FIG. 6, it is observed that the turnover temperature moves to the high temperature side with a larger cut angle θ of the Euler angle (φ, θ, φ) of the $La_3Ga_5SiO_{14}$ single crystal, similar to how the curves in FIG. 5 move to the high temperature side with a larger cut angle θ.

Figure 7:
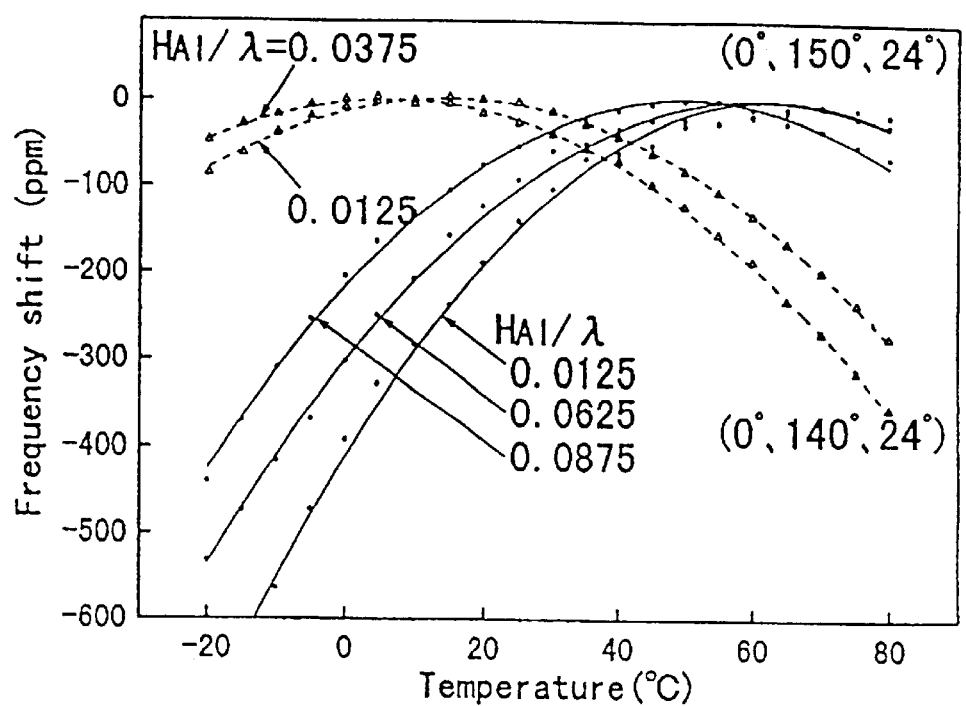
FIG. 7 is a characteristic graph showing the relationship between the temperature and the frequency shift with respect to the electrode film thickness.

Then, the manner in which the curves of the frequency shift with respect to the temperature change, depending on the film thickness H of the Al electrode formed on a piezoelectric substrate of an $La_3Ga_5SiO_{14}$ single crystal is shown in FIG. 7.

In FIG. 7, Δ represents the measured values of a piezoelectric substrate of an $La_3Ga_5SiO_{14}$ single crystal when the Euler angle (φ, θ, φ) is (0°, 140°, 24°), and • represents the measured values of a piezoelectric substrate of an $La_3Ga_5SiO_{14}$ single crystal when the Euler angle (φ, θ, φ) is (0°, 150°, 24°). Moreover, $H_{A1}/λ$ represents the ratio of the film thickness H of an Al electrode with respect to the wavelength λ of a surface acoustic wave to be excited on the piezoelectric substrate and is referred to as a normalized thickness. From FIG. 7, it is clear that the curves move to the low temperature side as the film thickness H of the Al electrode increases.

From the above mentioned relationships, it was confirmed that the turnover temperature at which the frequency shift is substantially zero moves to the high temperature side with a larger cut angle θ of the Euler angle (φ, θ, φ) of the $La_3Ga_5SiO_{14}$ single crystal, and the turnover temperature moves to the low temperature side with a larger film thickness H of the Al electrode.

Since surface acoustic wave apparatuses such as surface acoustic wave resonators, surface acoustic wave filters, or other suitable surface acoustic wave elements and electronic components, are used in an ordinary temperature, by setting the turnover temperature at which the frequency shift is substantially zero between about 20° to about 30°, the frequency shift of the surface acoustic wave apparatuses are minimized.

Therefore, by determining the film thickness H of an Al electrode according to the turnover temperature shift to the high temperature side by the size of θ of the Euler angle (φ, θ, φ) of the $La_3Ga_5SiO_{14}$ single crystal, the turnover temperature can be set between about 20° C. and about 30°.

Then, the value of the film thickness H of an Al electrode capable of having the turnover temperature at about 20° C. to about 30° with the Euler angle (φ, θ, φ) in the range of (0°, 140 to 150°, 24°), which can provide the best $La_3Ga_5SiO_{14}$ single crystal characteristic, was determined.

As a result, it was discovered that the turnover temperature can be about 20° C. with H/λ=0.005 at the Euler angle (0°, 140°, 24°). Moreover, it was learned that the turnover temperature can be about 30° C. with H/λ=0.005 at the Euler angle (0°, 143°, 240°).

Furthermore, it was also discovered that the turnover temperature can be about 20° C. with H/λ=0.15 at the Euler angle (0°, 147°, 24°), and the turnover temperature can be about 30° C. with H/λ=0.15 at the Euler angle (0°, 150°, 24°).

Figure 8:
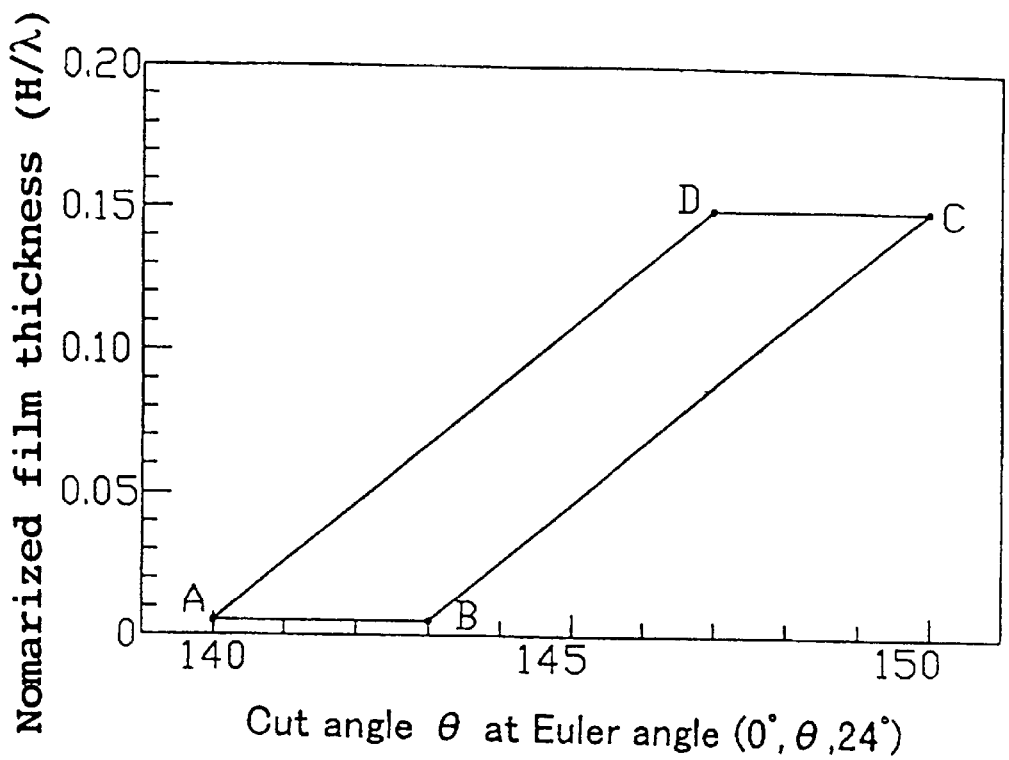
FIG. 8 is a characteristic graph showing the relationship between the electrode thickness and the cut angle of the Euler angle for explaining preferred embodiments of the present invention.

The range of the Euler angle and the H/λ, capable of setting the turnover temperature at about 20° to about 30° is as shown in FIG. 8. That is, those values existing in the inside or on the line of the area surrounded by the straight lines linking the points represented by: A (Euler angle 0°, 140°, 24°, H/λ=0.005), B (Euler angle 0°, 143°, 24°, H/λ= 0.005), C (Euler angle 0°, 150°, 24°,H/λ=0.15), D (Euler angle 0°, 147°, 24°, H/λ=0.15) have the turnover temperature in the range of about 20° C. to about 30° C., that is, in the range having a desired, very small frequency shift.

φ of the Euler angle (φ, θ, φ) defines the propagation direction of a surface acoustic wave. The propagation direction may generate an error of about 24°±1° depending on the production error of an IDT.

Although examples of a surface acoustic wave resonator, a longitudinally coupled surface acoustic wave filter, and a transversally coupled surface acoustic wave filter have been explained in the first to third preferred embodiments of the present invention, the present invention is not limited thereto. For example, a transversal type surface acoustic wave filter having a plurality of sets of interdigital transducers, or a surface acoustic wave resonator to be used in a ladder type filter with surface acoustic wave resonators arranged in a ladder configuration, or other similar devices and components, can be adopted, and the same effect can be obtained in a surface acoustic wave device with any kind of structure.

Furthermore, although surface acoustic wave apparatuses having a reflector have been explained in the first to third preferred embodiments of the present invention, the present invention is not limited thereto, but can be adopted in a surface acoustic wave apparatus without a reflector.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave resonator comprising:
   a piezoelectric substrate made of a langasite single crystal; and
   an interdigital transducer located on the surface of the piezoelectric substrate;
   wherein the Euler angle (φ, θ, φ) of the piezoelectric substrate is approximately (0°, 140° to 150°, 24°±1°), and the film thickness H of the interdigital transducer is within a range of about 0.005 to about 0.15 relative to the wavelength λ of a surface acoustic wave generated on the piezoelectric substrate; and
   the film thickness of the interdigital transducer is configured such that fluctuation of an operation frequency of the surface acoustic wave resonator is substantially zero between about 20° C. to about 30° C.

2. A duplexer comprising a surface acoustic wave resonator according to claim 1.

3. A communications apparatus comprising a duplexer according to claim 2.

4. A surface acoustic wave resonator according to claim 1, further comprising reflectors disposed at opposite ends of the piezoelectric substrate.

5. A surface acoustic wave filter comprising a surface acoustic wave resonator according to claim 1.

6. A communications apparatus comprising a surface acoustic wave filter according to claim 5.

7. A duplexer comprising a surface acoustic wave filter according to claim 5.

8. A communications apparatus comprising a surface acoustic wave resonator according to claim 1.

9. A surface acoustic wave resonator according to claim 1, wherein the interdigital transducer includes Al.

10. A method of manufacturing a surface acoustic wave device comprising the steps of:
    forming a piezoelectric substrate of a langasite single crystal;
    forming an interdigital transducer on the surface of the piezoelectric substrate; and
    selecting a film thickness of the interdigital transducer in accordance with the Euler angle (φ, θ, φ) of the piezoelectric substrate such that fluctuation of an operation frequency of the surface acoustic wave device is substantially zero between about 20° C. to about 30° C.

11. The method according to claim 10, wherein the Euler angle (φ, θ, φ) of the piezoelectric substrate is (0°, θ24°+1°); and
    a cut angle θ of the Euler angle and a normalized film thickness H/λ of the interdigital transducer fall within an area surrounded by the straight lines linking the points represented by:
    A (θ=140°, H/λ=0.005)
    B (θ=143°, H/λ=0.005)
    C (θ=147°, H/λ=0.15)
    D (θ=150°, H/λ=0.15)
    on a coordinate with respect to the cut angle θ and a normalized thickness H/λ, where H represents a film thickness of the interdigital transducer and λ represents a wavelength generated on the piezoelectric substrate.

12. The method according to claim 10, further comprising the step of forming reflectors at opposite ends of the piezoelectric substrate.

13. The method according to claim 10, wherein the interdigital transducer includes Al.

* * * * *